US010520993B1

(12) United States Patent
Han et al.

(10) Patent No.: US 10,520,993 B1
(45) Date of Patent: Dec. 31, 2019

(54) FIXING BRACKET AND CHASSIS USING THE SAME

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: He-Tao Han, Wuhan (CN); Jun-Hua Tan, Wuhan (CN); Ling-Xin Zeng, Wuhan (CN); Zhi-Qiang Li, Wuhan (CN); Yi-Sheng Lin, New Taipei (TW)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/437,231

(22) Filed: Jun. 11, 2019

(30) Foreign Application Priority Data

Oct. 11, 2018 (CN) .......................... 2018 1 1186089

(51) Int. Cl.
  *G06F 1/18* (2006.01)
  *H05K 7/14* (2006.01)

(52) U.S. Cl.
  CPC .............. *G06F 1/186* (2013.01); *G06F 1/185* (2013.01); *G06F 1/184* (2013.01); *H05K 7/1405* (2013.01); *H05K 7/1487* (2013.01)

(58) Field of Classification Search
  CPC .......... G06F 1/186; G06F 1/185; G06F 1/184; G06F 2200/1639; H05K 7/1408; H05K 7/1409; H05K 7/1405; H05K 7/1485; H05K 7/1487; F16B 2/10; F16B 2/12
  See application file for complete search history.

(56) References Cited

U.S. PATENT DOCUMENTS

| | | | | |
|---|---|---|---|---|
| 7,515,437 | B2* | 4/2009 | Dean ....................... | G06F 1/186 361/759 |
| 7,522,423 | B2* | 4/2009 | Chen ....................... | G06F 1/186 361/728 |
| 8,382,215 | B2* | 2/2013 | Chen ....................... | G06F 1/186 312/223.2 |
| 2004/0037048 | A1* | 2/2004 | Liao ....................... | H05K 7/1408 361/726 |
| 2004/0174687 | A1* | 9/2004 | Wang ....................... | G06F 1/184 361/801 |
| 2005/0111203 | A1* | 5/2005 | Bassett ................... | G06F 1/184 361/755 |
| 2007/0030631 | A1* | 2/2007 | Liang ....................... | G06F 1/186 361/600 |

(Continued)

*Primary Examiner* — Abhishek M Rathod
(74) *Attorney, Agent, or Firm* — ScienBiziP, P.C.

(57) ABSTRACT

A chassis includes a frame and a fixing bracket for fixing an expansion card to the frame. The frame defines at least one card hole and includes a side hook. The fixing bracket includes a bracket body, at least one rotating hook fixed to the bracket body and a movable hook fixed to the bracket body. The rotating hook and the movable hook are not in the same plane. When the at least rotating hook is inserted into the at least one card hole and the bracket body is rotated in a first direction to a predetermined position, the rotating hook is locked in the card hole, and the movable hook is hooked on the side hook to make the bracket body fix an expansion card to the frame.

16 Claims, 5 Drawing Sheets

(56) References Cited

U.S. PATENT DOCUMENTS

| | | | | |
|---|---|---|---|---|
| 2007/0081316 A1* | 4/2007 | Peng | ..................... | G06F 1/185 |
| | | | | 361/801 |
| 2010/0103602 A1* | 4/2010 | Xue | ..................... | G06F 1/185 |
| | | | | 361/679.4 |
| 2012/0127649 A1* | 5/2012 | Chen | ................... | H05K 7/1408 |
| | | | | 361/679.32 |

* cited by examiner

FIXING BRACKET AND CHASSIS USING THE SAME

FIELD

The subject matter herein generally relates to chassis.

BACKGROUND

Graphics cards are most important components of computers. The graphics card is fixed to a bracket by several screws and the bracket is fixed to the computer, which makes disassembly and assembly of the graphics card inconvenient.

Therefore, there is room for improvement within the art.

BRIEF DESCRIPTION OF THE DRAWINGS

Implementations of the present technology will now be described, by way of embodiments with reference to the attached figures.

DETAILED DESCRIPTION

Figure 1:
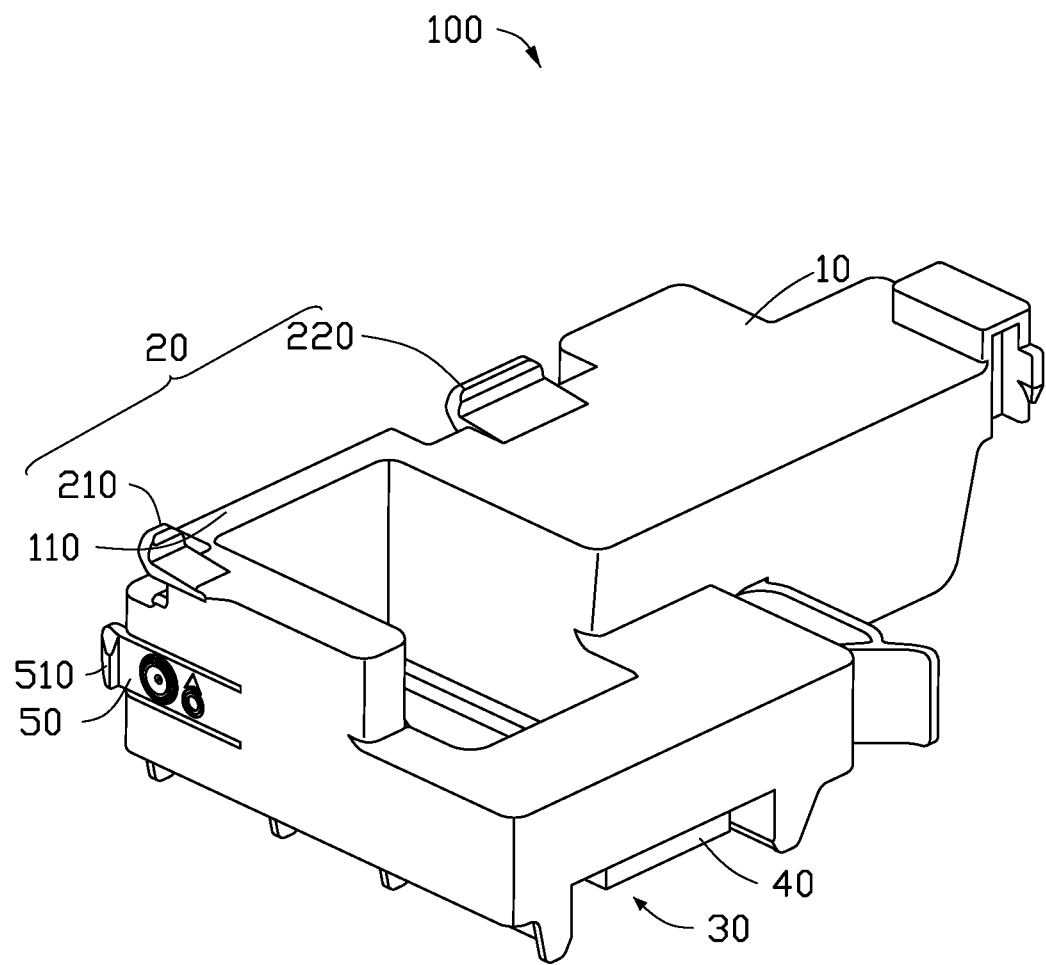
FIG. 1 is an isometric view of a fixing bracket according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to show details and features of the present disclosure better. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
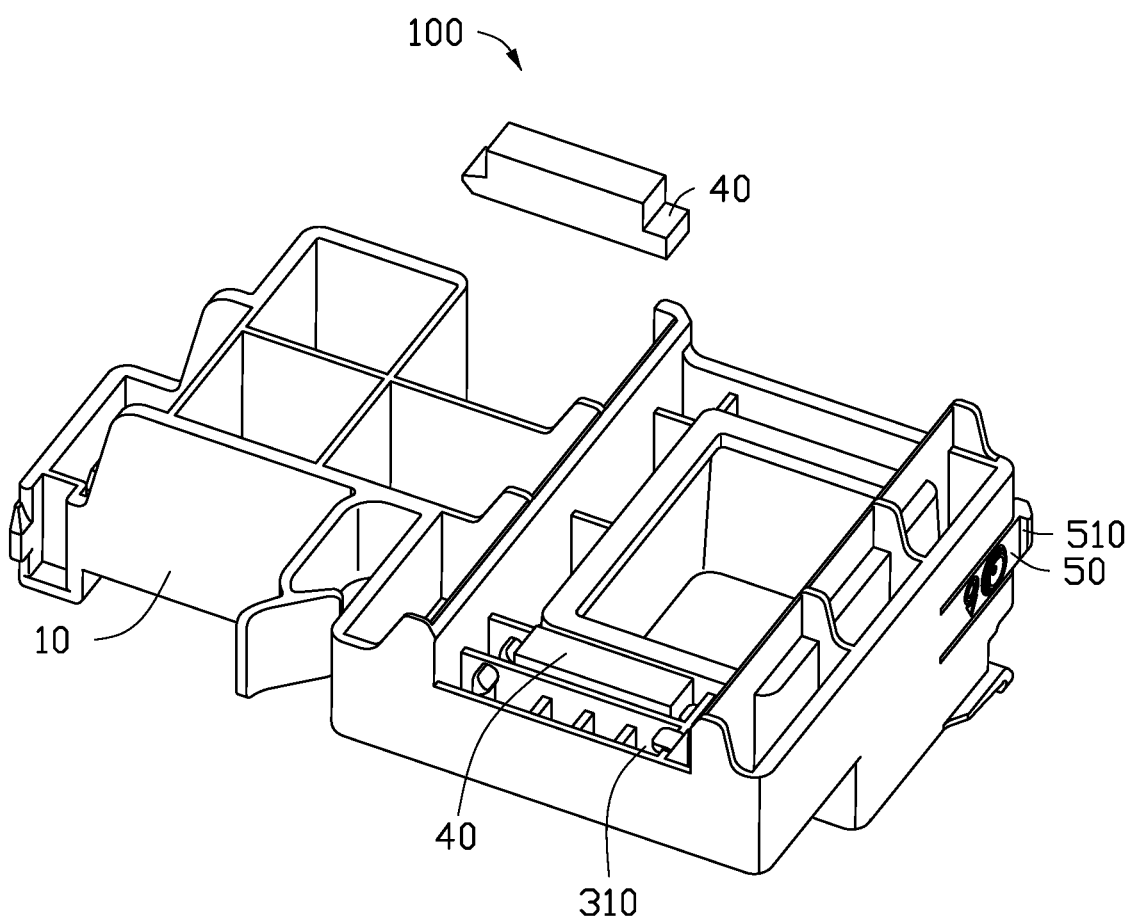
FIG. 2 is similar to FIG. 1, but viewed from another viewpoint.
Figure 3:
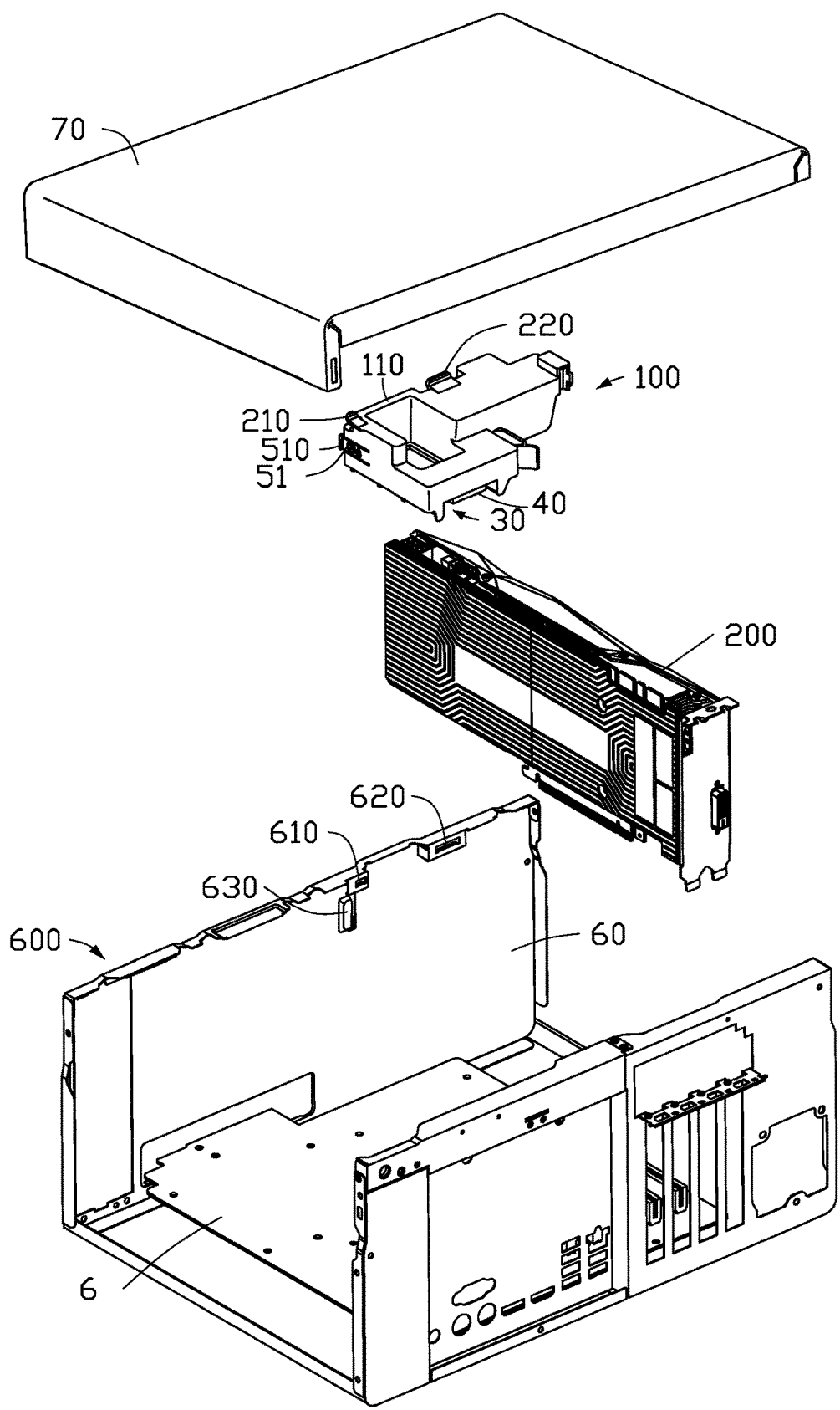
FIG. 3 is an exploded isometric view of a chassis with the fixing bracket of FIG. 1.

FIG. 1 to FIG. 3 illustrate a fixing bracket 100 according to a first embodiment of the present application. The fixing bracket 100 is used for fixing an expansion card 200 in a chassis 600. The chassis 600 defines at least one card hole, for example, a first card hole 610 and a second card hole 620, and has a side hook 630. The fixing bracket 100 includes a bracket body 10, at least one rotating hook 20 and a movable hook 51. The at least one rotating hook 20 and the movable hook 51 are fixed to the bracket body 10. The rotating hook 20 and the movable hook 51 are not in the same plane. An end of the rotating hook 20 is fixed to a first side of the bracket body 10, and an end of the movable hook 51 is fixed to a second side of the bracket body 10. In the embodiment, the first side is substantially perpendicular to the second side.

When the rotating hook 20 is inserted into the card hole and the bracket body 10 is rotated in a first direction to a predetermined position, the rotating hook 20 is locked in the card hole, and the movable hook 51 is hooked on the side hook 630 to make the bracket body 10 fix the expansion card 200 to the chassis 600.

The fixing bracket 100 further includes a clip structure 30. The clip structure 30 is fixed to one side of the bracket body 10 for holding the expansion card 200. The clip structure 30 is substantially U-shaped, and the U-shaped port of the clip structure 30 faces the expansion card 200 to clamp the expansion card 200. The fixing bracket 100 further includes a foot pad 40. The foot pad 40 is mounted on the clip structure 30. A number of grooves 310 are defined in the clip structure 30. The foot pad 40 is made of a resilient material, such as rubber. The foot pad 40 is selectively mounted in one of the grooves 310. The foot pad 40 includes two bosses. The two bosses are locked in one of the grooves 310 to fix the foot pad 40 to the clip structure 30.

It can be understood that the foot pad 40 can also be other shapes such as a rectangle. The foot pad 40 and the groove 310 can also be fixed by other method, for example, using an interference fit. The way to fix it. The foot pad 40 can be mounted in different grooves 310 according to the height and length of the expansion card 200.

The fixing bracket 100 further includes an elastic arm 50. A first end of the elastic arm 50 is fixed to the bracket body 10 and adjacent to the rotating hook 20, and a second end of the elastic arm 50 is fixed to the movable hook 51. When the elastic arm 50 is pressed, the elastic arm 50 is movable in the pressing direction. In another embodiments, if the elastic arm 50 is absent, when the fixing bracket 100 is to be unlocked in the chassis 600, the side hook 630 is swung away from the movable hook 51, and the fixing bracket 100 is rotated to a predetermined position, the side hook 630 is reset to drive the movable hook 51 to unlock from the side hook 630. When the fixing bracket 100 is to be fixed to the chassis 600, the side hook 630 is also swung away from the movable hook 51, and the fixing bracket 100 is rotated to another predetermined position, the side hook 630 is reset to drive the movable hook 51 to lock the side hook 630.

The bracket body 10 rotates around the chassis 600 through the rotating hook 20, and drives the clip structure 30, the foot pad 40 and the elastic arm 50 to rotate.

The bracket body 10 includes a protrusion 110. The protrusion 110 faces away from the clip structure 30.

In the embodiment, the fixing bracket 100 includes two rotating hooks 20. The two rotating hooks 200 are a first hook 210 and a second hook 220. The first hook 210 and the second hook 220 are spaced apart from each other on both sides of the protrusion 110. The extending direction of the first hook 210 and the second hook 220 is consistent with the direction of the protrusion 110, and the lengths of the first hook 210 and the second hook 220 are the same.

The chassis 600 includes a frame 6. The frame 6 includes a first wall 60 and a second wall 70. The first wall 60 is substantially perpendicularly connected to the second wall 70. The second wall 70 can be disassembled from the first wall 60. A first card hole 610 and a second card hole 620 are defined on the first wall 60. The first card hole 610 and the second card hole 620 are configured to be received the first hook 210 and the second hook 220. One of the side hook 630 on the first wall 60 is engaged with the movable hook 51.

When the fixing bracket 100 is not mounted on the chassis 600, the first hook 210 and the second hook 220 are not locked in the first card hole 610 and the second card hole 620. The movable hook 51 is disengaged from the side hook 630, and the fixing bracket 100 is not locked to the chassis 600.

Figure 4:
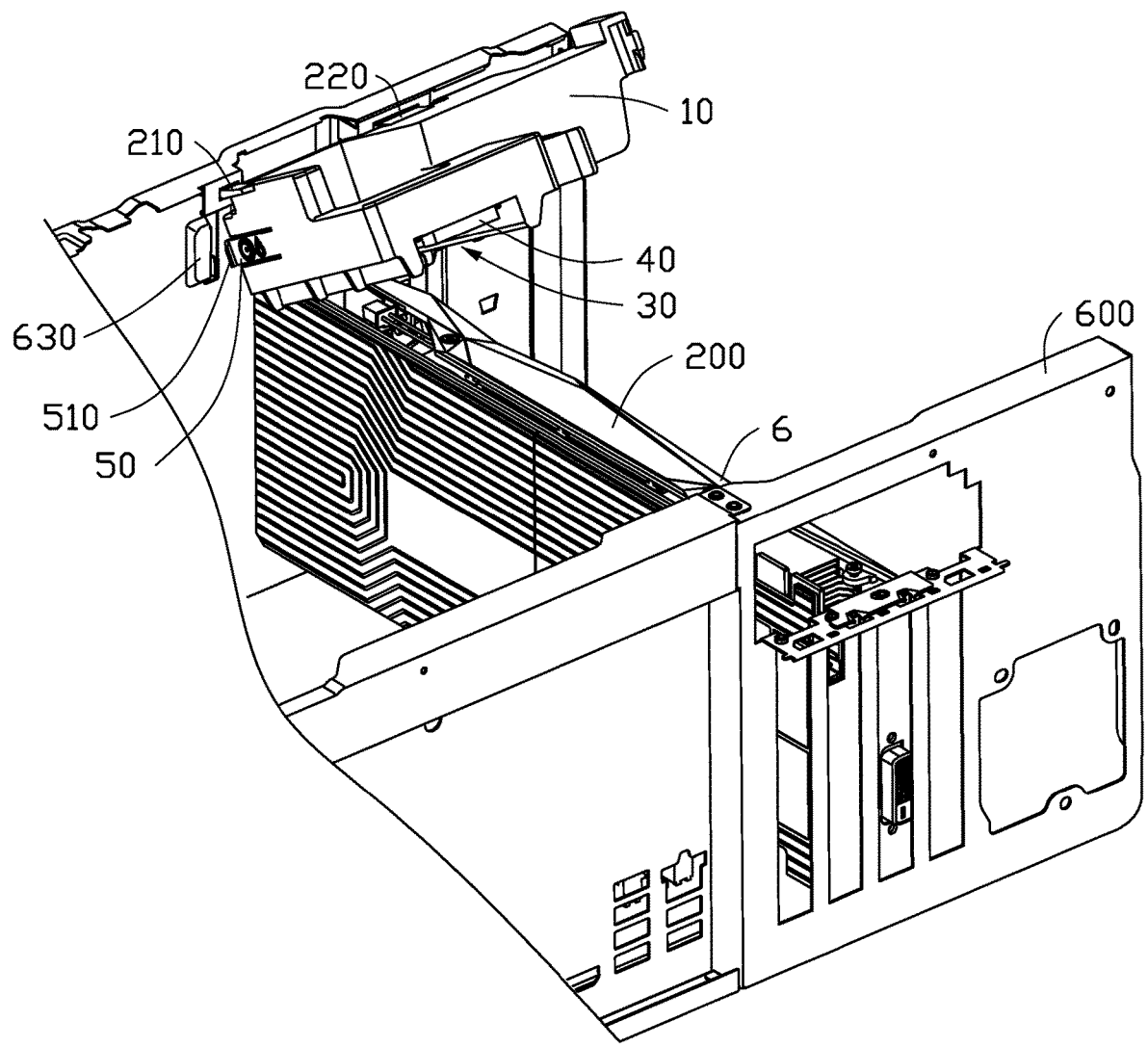
FIG. 4 is an isometric view of the chassis in FIG. 3 with the fixing bracket rotated to a preset position.

Referring to FIG. 4, when to mount the fixing bracket 100 on the chassis 600, the first hook 210 and the second hook 220 are locked into the first card hole 610 and the second card hole 620. The bracket body 10 is rotated in a clockwise direction with a line connecting the first hook 210 and the second hook 220 as an axis. When the bracket body 10 is rotated to a predetermined position, the elastic arm 50 is pressed to make the movable hook 51 be locked to the side hook 630, and the protrusion 110 is locked to the first wall 60. Thus, the clip structure 30 clamps the expansion card 200 to prevent the expansion card 200 from moving. The second wall 70 is pressed against the fixed bracket 100 and the second wall 70 is connected to the first wall 60.

In the embodiment, the expansion card 200 is a graphics card. It can be understood that the expansion card 200 can be a memory or other card.

Figure 5:
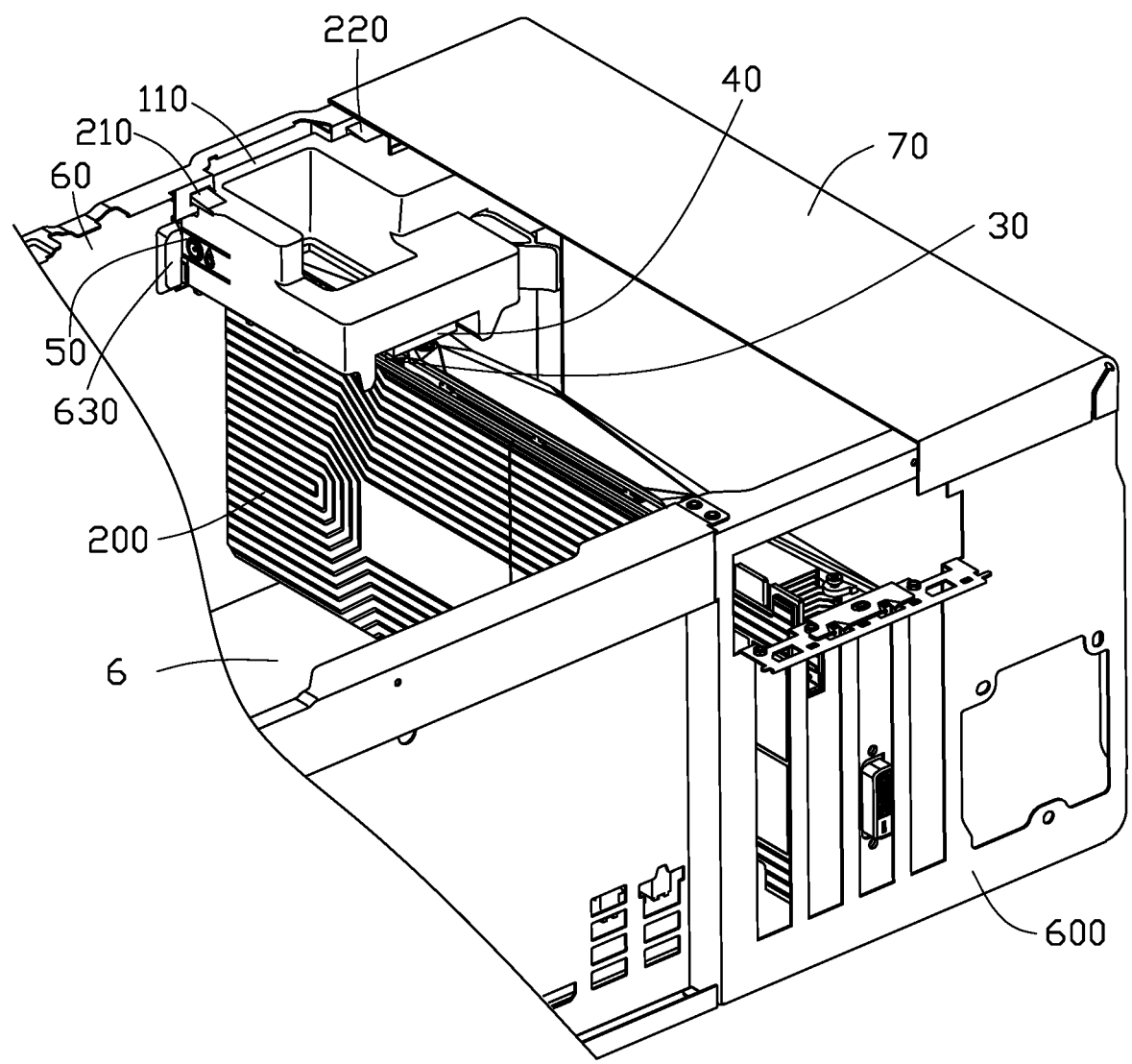
FIG. 5 is similar to FIG. 4, but with the fixing bracket fixed in the chassis.

Referring to FIG. 5, the first hook 210 and the second hook 220 are locked to the first card hole 610 and the second card hole 620, and the movable hook 51 is locked to the side hook 630. The fixing bracket 100 is locked on the chassis 600 and abuts the expansion card 200. The first wall 60 abuts the fixing bracket 100, and the second wall 70 presses the fixing bracket 100 to prevent the fixing bracket 100 from moving.

When to detach the fixing bracket 100 shown in FIG. 5 from the chassis 600, first, the second wall 70 is detached from the first wall 60. The elastic arm 50 is pressed and the bracket body 10 is rotated in a counterclockwise direction by a line connecting the first hook 210 and the second hook 220 to another predetermined position, and the elastic arm 50 is released to be reset, so that the movable hook 51 is disengaged from the side hook 630, and the clip structure 30 and the foot pad 40 are separated from the expansion card 200. The first hook 210 and the second hook 220 are unlocked in the first card hole 610 and the second card hole 620, and the protrusion 110 is disengaged from the bracket body 10. In this way, the fixing bracket 100 is detached from the first wall 60 and releases the expansion card 200.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A fixing bracket configured to fix an expansion card in a chassis defining two card holes and having a side hook, the fixing bracket comprising:
    a bracket body;
    two rotating hooks fixed to the bracket body; and
    a movable hook fixed to the bracket body,
    wherein the two rotating hooks and the movable hook are not in the same plane, when the two rotating hooks are respectively inserted into the two card holes and the bracket body is rotated in a first direction to a predetermined position, the two rotating hooks are locked in the respective card holes, and the movable hook is hooked on the side hook to make the bracket body fix the expansion card to a frame of the chassis,
    wherein bracket body comprises a protrusion, the protrusion is positioned between the two rotating hooks, the bracket body is engaged to the chassis by locking the protrusion to the chassis, and the bracket body is disengaged from the chassis by unlocking the protrusion from the chassis.

2. The fixing bracket of claim 1, further comprising:
    a clip structure fixed to the bracket body for holding the expansion card.

3. The fixing bracket of claim 2, further comprising:
    a foot pad;
    wherein a plurality of grooves are defined in the clip structure, the foot pad is selectively mounted in one of the grooves.

4. The fixing bracket of claim 3, wherein the foot pad is made of a resilient material.

5. The fixing bracket of claim 4, wherein the foot pad comprises two bosses, the two bosses are locked in one of the grooves to fix the foot pad to the clip structure.

6. The fixing bracket of claim 2, wherein the clip structure is U-shaped, and the U-shaped port of the clip structure faces the expansion card to clamp the expansion card.

7. The fixing bracket of claim 1, further comprising:
    an elastic arm fixed to the bracket body and the movable hook;
    wherein when the fixing bracket is detached from the chassis, the elastic arm is pressed and the bracket body is rotatable in a first direction to a predetermined position to lock the movable hook to the side hook; when the fixing bracket is fixed to the chassis, the elastic arm is pressed and the bracket body is rotatable in a second direction to another predetermined position to unlock the movable hook from the side hook, the first direction being opposite to the second direction.

8. A chassis comprising:
    a frame defining two card holes and comprising a side hook; and
    a fixing bracket comprising:
        a bracket body;
        two rotating hooks fixed to the bracket body; and
        a movable hook fixed to the bracket body,
    wherein the two rotating hooks and the movable hook are not in the same plane, when the two rotating hooks are respectively inserted into the two card holes and the bracket body is rotated in a first direction to a predetermined position, the rotating hooks are locked in the respective card holes, and the movable hook is hooked on the side hook to make the bracket body fix an expansion card to the frame, wherein bracket body comprises a protrusion, the protrusion is positioned between the two rotating hooks, the bracket body is engaged to the chassis by locking the protrusion to the chassis, and the bracket body is disengaged from the chassis by unlocking the protrusion from the chassis.

9. The chassis of claim 8, wherein the fixing bracket further comprises a clip structure fixed to the bracket body for holding the expansion card.

10. The chassis of claim 9, wherein the fixing bracket further comprises a foot pad, a plurality of grooves are defined in the clip structure, the foot pad is selectively mounted in one of the grooves.

11. The chassis of claim 10, wherein the foot pad is made of a resilient material.

12. The chassis of claim 11, wherein the foot pad comprises two bosses, the two bosses are locked in one of the grooves to fix the foot pad to the clip structure.

13. The chassis of claim 9, wherein the clip structure is U-shaped, and the U-shaped port of the clip structure faces the expansion card to clamp the expansion card.

14. The chassis of claim 8, wherein the fixing bracket further comprises an elastic arm fixed to the bracket body and the movable hook, when the fixing bracket is detached from the chassis, the elastic arm is pressed and the bracket body is rotatable in a first direction to a predetermined position to lock the movable hook to the side hook; when the fixing bracket is fixed to the chassis, the elastic arm is pressed and the bracket body is rotatable in a second direction to another predetermined position to unlock the movable hook from the side hook, the first direction being opposite to the second direction.

15. The chassis of claim 8, wherein the frame comprises a first wall and a second wall, the first wall is perpendicularly connected to the second wall and abuts the fixing bracket, the second wall is configured to be disassembled from the first wall, the at least one card hole is defined on the first wall.

16. The chassis of claim 8, wherein the expansion card is graphics card.

* * * * *